United States Patent
Kawano et al.

(10) Patent No.: US 8,188,466 B2
(45) Date of Patent: May 29, 2012

(54) RESISTANCE VARIABLE ELEMENT

(75) Inventors: Hiroyasu Kawano, Kawasaki (JP); Keiji Shono, Kawasaki (JP); Manabu Gomi, Nagoya (JP); Takeshi Yokota, Nagoya (JP)

(73) Assignees: Fujitsu Limited, Kawasaki (JP); National University Corporation Nagoya Institute of Technology, Nagoya (JP)

( * ) Notice: Subject to any disclaimer, the term of this patent is extended or adjusted under 35 U.S.C. 154(b) by 68 days.

(21) Appl. No.: 12/423,429

(22) Filed: Apr. 14, 2009

(65) Prior Publication Data

US 2009/0218565 A1   Sep. 3, 2009

Related U.S. Application Data

(63) Continuation of application No. PCT/JP2007/070117, filed on Oct. 16, 2007.

(30) Foreign Application Priority Data

Oct. 16, 2006   (JP) .................................. 2006-280855

(51) Int. Cl.
*H01L 29/10* (2006.01)
*H01L 29/12* (2006.01)

(52) U.S. Cl. .................... 257/43; 257/2; 257/4

(58) Field of Classification Search .............. 257/2, 4, 257/43, 295, 310; 438/3, 385
See application file for complete search history.

(56) References Cited

U.S. PATENT DOCUMENTS

| | | | |
|---|---|---|---|
| RE28,792 E | 4/1976 | Ruka et al. | |
| 4,947,125 A | 8/1990 | De Pous | |
| 5,880,406 A | 3/1999 | Gerstel et al. | |
| 5,972,200 A | 10/1999 | Kim | |
| RE37,223 E | 6/2001 | Bose et al. | |
| 6,900,498 B2* | 5/2005 | Stauf et al. ................... | 257/310 |
| 7,060,586 B2 | 6/2006 | Li et al. | |
| 7,259,387 B2 | 8/2007 | Kawazoe et al. | |
| 7,307,270 B2 | 12/2007 | Aratani et al. | |
| 7,417,271 B2 | 8/2008 | Genrikh et al. | |
| 2005/0127524 A1 | 6/2005 | Sakamoto et al. | |
| 2005/0247921 A1 | 11/2005 | Lee et al. | |
| 2005/0274999 A1* | 12/2005 | Itokawa et al. ............... | 257/295 |
| 2008/0001172 A1* | 1/2008 | Karg et al. ................... | 257/194 |
| 2008/0011996 A1* | 1/2008 | Bednorz et al. ................... | 257/2 |
| 2009/0012823 A1 | 1/2009 | Anderson et al. | |

FOREIGN PATENT DOCUMENTS

| | | |
|---|---|---|
| JP | A 2004-273615 | 9/2004 |
| JP | A 2004-281913 | 10/2004 |
| JP | A 2005-123361 | 5/2005 |
| JP | A 2005-203463 | 7/2005 |

(Continued)

*Primary Examiner* — Victor A Mandala
*Assistant Examiner* — Errol Fernandes

(57) ABSTRACT

A resistance variable element is provided, which is capable of performing bipolar operation by a specified mechanism and usable as a memory. The resistance variable element has a laminated structure including an electrode, another electrode, an oxide layer between the electrodes, and an oxide layer in contact with the oxide layer between the oxide layer and the electrode. The oxide layer is switchable from the low-resistance state to the high-resistance state by donating oxygen ions to the oxide layer, and from the high-resistance state to the low-resistance state by accepting oxygen ions from the oxide layer. The oxide layer is switchable from the low-resistance state to the high-resistance state by accepting oxygen ions from the oxide layer, and from the high-resistance state to the low-resistance state by donating oxygen ions to the oxide layer.

12 Claims, 15 Drawing Sheets

FOREIGN PATENT DOCUMENTS

| | | |
|---|---|---|
| JP | 2005-317976 | 11/2005 |
| JP | A 2005-328044 | 11/2005 |
| JP | A 2006-173267 | 6/2006 |
| JP | A 2007-88349 | 4/2007 |
| JP | A 2007-235139 | 9/2007 |
| WO | WO 03/094227 A1 | 11/2003 |

* cited by examiner

Sample Element S1

| Electrode 2 | Ti (Thickness 50nm) |
| --- | --- |
| Oxygen Accepting Layer 4 | TiO$_2$ (Amorphous, Oxigen-Deficient, Thickness 3nm) |
| Oxygen Supplying Layer 3 | (Pr, Ca)MnO$_3$ (Crystalline, Thickness 100nm) |
| Electrode 1 | Pt (Thickness 50nm) |
| Substrate S | MgO |

Sample Element S2

| Electrode 2 | Pt (Thickness 50nm) |
| --- | --- |
| Oxygen Accepting Layer 4 | TiO$_2$ (Amorphous, Oxigen-Deficient, Thickness 3nm) |
| Oxygen Supplying Layer 3 | (Pr,Ca)MnO$_3$ (Crystalline, Thickness 100nm) |
| Electrode 1 | Pt (Thickness 50nm) |
| Substrate S | MgO |

Sample Element S3

| Electrode 2 | Ti (Thickness 50nm) |
| --- | --- |
| Oxygen Accepting Layer 4 | TiO$_2$ (Amorphous, Oxigen-Deficient, Thickness 3nm) |
| Oxygen Supplying Layer 3 | (Pr,Ca)MnO$_3$ (Crystalline, Thickness 100nm) |
| Electrode 1 | Pt (Thickness 50nm) |
| Substrate S | MgO |

Cumulative Number of Times of Voltage Application (times)

Sample Element S4

| Electrode 2 | Ti (Thickness 50nm) |
|---|---|
| Psesudo Oxygen Accepting Layer | $TiO_2$ (Amorphous, Thickness 3nm) |
| Oxygen Supplying Layer 3 | $(Pr, Ca)MnO_3$ (Crystalline, Thickness 100nm) |
| Electrode 1 | Pt (Thickness 50nm) |
| Substrate S | MgO |

Sample Element S5

| Electrode 2 | Ti (Thickness 50nm) |
|---|---|
| Pseudo Oxygen Accepting Layer | ZnO (Amorphous, Oxygen-Deficient, Thickness 3nm) |
| Oxygen Supplying Layer 3 | (Pr, Ca)MnO$_3$ (Crystalline, Thickness 100nm) |
| Electrode 1 | Pt (Thickness 50nm) |
| Substrate S | MgO |

Sample Element S6

| Electrode 2 | Ti (Thickness 50nm) |
|---|---|
| Oxygen Supplying Layer 3 | (Pr, Ca)MnO$_3$ (Crystalline, Thickness 100nm) |
| Electrode 1 | Pt (Thickness 50nm) |
| Substrate S | MgO |

Sample Element S7

| Electrode 2 | Pt (Thickness 50nm) |
| --- | --- |
| Oxygen Supplying Layer 3 | $(Pr, Ca)MnO_3$ (Crystalline, Thickness 100nm) |
| Electrode 1 | Pt (Thickness 50nm) |
| Substrate S | MgO |

Sample Element S8

| Electrode 2 | Ti (Thickness 50nm) |
| --- | --- |
| Oxygen Accepting Layer 4 | TiO$_2$ (Amorphous, Oxigen-Deficient, Thickness 3nm) |
| Oxygen Supplying Layer 3 | (Pr, Ca)MnO$_3$ (Crystalline, Thickness 100nm) |
| Electrode 1 | Pt (Thickness 50nm) |
| Substrate S | MgO |

Sample Element S9

| Electrode 2 | Ti (Thickness 50nm) |
| --- | --- |
| Oxygen Accepting Layer 4 | TiO$_2$ (Amorphous, Oxigen-Deficient, Thickness 3nm) |
| Oxygen Supplying Layer 3 | ZrO$_2$ (Crystalline, Oxygen-Deficient, Thickness 100nm) |
| Electrode 1 | Pt (Thickness 50nm) |
| Substrate S | MgO |

Sample Element S10

| Electrode 2 | Ti (Thickness 50nm) |
| --- | --- |
| Oxygen Accepting Layer 4 | TiO$_2$ (Amorphous, Oxigen-Deficient, Thickness 3nm) |
| Oxygen Supplying Layer 3 | ZrO$_2$ (Amorphous, Oxigen-Deficient, Thickness 100nm) |
| Electrode 1 | Pt (Thickness 50nm) |
| Substrate S | MgO |

Sample Element S11

| Electrode 2 | Ti (Thickness 50nm) |
| --- | --- |
| Oxygen Accepting Layer 4 | TiO$_2$ (Amorphous, Oxigen-Deficient, Thickness 3nm) |
| Pseudo Oxygen Supplying Layer | ZrO$_2$ (Crystalline, Thickness 100nm) |
| Electrode 1 | Pt (Thickness 50nm) |
| Substrate S | MgO |

Cumulative Number of Times of Voltage Application (times)

Sample Element S12

| Electrode 2 | Ti (Thickness 50nm) |
|---|---|
| Oxygen Accepting Layer 4 | $TiO_2$ (Amorphous, Oxigen-Deficient, Thickness 3nm) |
| Pseudo Oxygen Supplying Layer | $Al_2O_3$ (Crystalline, Oxigen-Deficient, Thickness 100nm) |
| Electrode 1 | Pt (Thickness 50nm) |
| Substrate S | MgO |

Cumulative Number of Times
of Voltage Application (times)

RESISTANCE VARIABLE ELEMENT

This application is a U.S. Continuation of International application No. PCT/JP2007/070117, filed Oct. 16, 2007.

TECHNICAL FIELD

The present invention relates to a resistance variable element which is switchable between a high-resistance state in which relatively small current flows and a low-resistant state in which relatively large current flows.

BACKGROUND ART

In the technical field of a nonvolatile memory, much attention is being focused on a ReRAM (resistive RAM). A ReRAM is a resistance variable element generally including a pair of electrodes and a recording film which is selectively switchable between a high-resistance state and a low-resistance state depending on the voltage applied between the paired electrodes. In the ReRAM, the selective switching of the resistance state of the recording film is utilized to record or rewrite information. Examples of such a ReRAM and resistance variable element are disclosed in Patent Documents 1-5 given below.

Patent Document 1: International Publication Pamphlet No. WO 2003/094227
Patent Document 2: Japanese Laid-open Patent Publication No. 2004-273615
Patent Document 3: Japanese Laid-open Patent Publication No. 2004-281913
Patent Document 4: Japanese Laid-open Patent Publication No. 2005-123361
Patent Document 5: Japanese Laid-open Patent Publication No. 2005-203463

ReRAMs are generally divided into a bipolar type and a unipolar type from the viewpoint of the electrical characteristics. In a bipolar type ReRAM, the direction of voltage application between the paired electrodes to shift the recording film from the high-resistance state to the low-resistance state differs from that to shift the recording film from the low-resistance state to the high-resistance state. That is, in a bipolar type ReRAM, voltages of different polarities are utilized in the shifting or switching between the two kinds of resistance states. In a unipolar type ReRAM, on the other hand, the direction of voltage application between the paired electrodes to shift the recording film from the high-resistance state to the low-resistance state is the same as that to shift the recording film from the low-resistance state to the high-resistance state. That is, in a unipolar type ReRAM, voltage of the same polarity is utilized in the switching between the two kinds of resistance states. Generally, the operation speed of a bipolar type ReRAM is higher than that of a unipolar type ReRAM.

As a bipolar type ReRAM, a ReRAM including a recording film made of $PrCaMnO_3$ and a ReRAM including a recording film made of $SrZrO_3$ to which Cr is added have been reported. However, although the fact that these ReRAMs are capable of performing bipolar operation is known, the mechanism of operation has not been figured out. Since the mechanism of operation is unclear, the optimum material, dimension and so on of each part of the ReRAM cannot be determined, so that the optimum designing of the ReRAM is difficult. It is considered that the mechanism of operation of a ReRAM differs largely depending on the kind of the material of the recording film.

The present invention has been proposed under the circumstances described above. It is, therefore, an object of the present invention to provide a resistance variable element which is capable of performing bipolar operation by a specified mechanism of operation and usable as a memory element.

DISCLOSURE OF THE INVENTION

A resistance variable element provided according to the present invention includes a laminated structure comprising a first electrode, a second electrode, a first oxide layer positioned between the first electrode and the second electrode, and a second oxide layer held in contact with the first oxide layer and positioned between the first oxide layer and the second electrode. The first oxide layer is switchable from the low-resistance state to the high-resistance state by donating oxygen ions to the second oxide layer and switchable from the high-resistance state to the low-resistance state by accepting oxygen ions from the second oxide layer. The second oxide layer is switchable from the low-resistance state to the high-resistance state by accepting oxygen ions from the first oxide layer and switchable from the high-resistance state to the low-resistance state by donating oxygen ions to the first oxide layer.

The resistance variable element having this structure is switchable between the low-resistance state in which both of the first oxide layer and the second oxide layer are in the low-resistance state and the high-resistance state in which both of the first oxide layer and the second oxide layer are in the high-resistance state.

When a predetermined voltage is applied across the first and the second electrodes of this element in the low-resistance state with the first electrode and the second electrode held negative and positive, respectively, oxygen ions are generated in the first oxide layer and the oxygen ions move from the first oxide layer to the second oxide layer due to the electric field effect (i.e., donation of oxygen ions from the first oxide layer to the second oxide layer occurs). As a result, positive deficiencies (positively-charged oxygen vacancies in this case) are generated in the first oxide layer or the positive deficiencies in the first oxide layer increase. In the first oxide layer, the positive deficiencies are localized to a portion close to the first electrode. As a result, an internal electric field having an opposite polarity from the applied voltage is generated in the first oxide layer. The internal electric field hinders the movement of electrons or holes which are the main carriers in this element. Thus, due to the oxygen ion donation from the first oxide layer to the second oxide layer, the first oxide layer shifts from the low-resistance state to the high-resistance state. On the other hand, the second oxide layer is further oxidized (i.e., the degree of oxidation by oxygen increases) by accepting oxygen ions from the first oxide layer. The increase in the degree of oxidation hinders the movement of electrons or holes which are the main carriers in this element. Thus, by accepting oxygen ions from the first oxide layer, the second oxide layer shifts from the low-resistance state to the high-resistance state. In this way, since both of the first oxide layer and the second oxide layer shift from the low-resistance state to the high-resistance state, the element shifts from the low-resistance state to the high-resistance state. Even when the voltage is reduced, the first and the second oxide layers maintain the high-resistance state, so that the element maintains the high-resistance state.

When a predetermined voltage is applied across the first and the second electrodes of this element in the high-resistance state with the first electrode and the second electrode held positive and negative, respectively, oxygen ions return from the second oxide layer to the first oxide layer due to the electric field effect (i.e., donation of oxygen ions from the second oxide layer to the first oxide layer occurs), whereby the second oxide layer is reduced (i.e., the degree of oxidation by oxygen reduces). This reduction in the degree of oxidation is desirable for the movement of electrons or holes which are the main carriers in this element. (The lower the degree of oxidation is, i.e., the more the oxygen deficiencies are, the lower the resistance of an oxide is. This tendency is noticeable in e.g. a transition metal oxide.) Thus, by the donation of oxygen ions from the second oxide layer to the first oxide layer, the second oxide layer shifts from the high-resistance state to the low-resistance state. Meanwhile, due to the acceptance of oxygen ions from the second oxide layer, the positive deficiencies in the first oxide layer reduce or disappear. The reduction or disappearance of the positive deficiencies causes the internal electric field in the first oxide layer to reduce or disappear. This is desirable for the movement of electrons or holes which are the main carriers in this element. Thus, by accepting oxygen ions from the second oxide layer, the first oxide layer shifts from the high-resistance state to the low-resistance state. In this way, since both of the first oxide layer and the second oxide layer shift from the high-resistance state to the low-resistance state, the element shifts from the high-resistance state to the low-resistance state. Even when the voltage is eliminated, the first and the second oxide layers maintain the low-resistance state, so that the element maintains the low-resistance state. The element in the low-resistance state can be shifted to the high-resistance state again through the above-described process for achieving the high-resistance state.

In this element, the direction of voltage application across the electrodes in the process for shifting from the low-resistance state to the high-resistance differs from that in the process for shifting from the high-resistance state to the low-resistance state. When the element switches between the high-resistance state and the low-resistance state, oxygen ions move reversibly within each of the oxide layers and between the two oxide layers.

As described above, the element is properly switched between the high-resistance state in which less current flows and the low-resistance state in which more current flows by the bipolar operation. With this element, recording or rewriting of information can be performed by utilizing the selective switching of the resistance state. Thus, the element can be used as a resistance-variable nonvolatile memory element. Further, the element can also be used as a switching element for selectively changing the resistance at a predetermined point in a circuit.

Preferably, the first oxide layer and/or the second oxide layer is made of a conductive oxide. This arrangement is desirable for generating oxygen ions and oxygen vacancies without inducing breakage of a substance or structure between the two oxide layers due to dielectric breakdown and for reversibly moving the oxygen ions within each oxide layer and between the two oxide layers. Preferably, the activation energy of each oxide layer for the transfer of oxygen ions is not more than 2 eV.

Preferably, an alkaline earth element is added to the first oxide layer. Preferably, the first oxide layer and/or the second oxide layer is in an oxygen deficient state (the state in which a significant amount of oxygen vacancies which are free of electric charge exist). These arrangements are desirable for enhancing the conductivity of the first oxide layer and/or the second oxide layer, oxygen ion mobility of the first oxide layer and/or the second oxide layer and the readiness of transfer of oxygen ions between the two oxide layers. To accept oxygen ions inherent in the first oxide layer, an oxygen-deficient oxide is preferable as the material of the second oxide layer.

Preferably, the first oxide layer is made of a fluorite structure oxide, a perovskite structure oxide, a pyrochlore structure oxide, a tungsten bronze structure oxide or a brownmillerite structure oxide. As the fluorite structure oxide, use may be made of $ZrO_2$ to which Y, Mg or Ca is added (partially stabilized zirconia), $ZrO_2$ and $CeO_2$. As the perovskite structure oxide, use may be made of $PrMnO_3$ and $SrTiO_3$. As the pyrochlore structure oxide, use may be made of $Nd_2Mo_2O_7$ and so on. As the tungsten bronze structure oxide, use may be made of $CuWO_3$ and so on. As the brownmillerite structure oxide, use may be made of $Sr_2Fe_2O_5$ and so on. With these arrangements, a good first oxide layer is provided.

Preferably, the first oxide layer is made of a crystalline material. The scattering factor for the oxygen ion transfer tends to be smaller in a crystalline material in which oxygen ions are movable than in an amorphous material in which oxygen ions are movable. Thus, in view of the enhancement of the oxygen ion mobility in the first oxide layer, a crystalline material is preferable to an amorphous material as the material of the first oxide layer.

Preferably, the second oxide layer is made of a transition metal oxide. In an oxide of a transition metal which is likely to change in valency in the oxygen deficient state, transition metals of different valencies exist. Thus, such a transition metal oxide readily accepts oxygen ions for a stable valency state of the transition metal. For an oxide of a transition metal which is likely to change in valency, the energy application required to discharge oxygen ions is relatively small. Thus, a transition metal oxide is desirable as the material of the second oxide layer.

Preferably, the second oxide layer is made of an amorphous material. To accept oxygen ions inherent in the first oxide layer, an amorphous material which is structurally soft is preferable to a structurally hard crystalline material as the material of the second oxide layer.

Preferably, the second electrode contains a transition metal. When an excessive amount of oxygen ions are donated from the first oxide layer to the second oxide layer, the second electrode of this arrangement can accept part of the donated oxygen ions.

Preferably, the resistance variable element further includes an oxygen ion generation promoting layer held in contact with the first oxide layer and positioned between the first oxide layer and the first electrode. Preferably, the resistance variable element further includes an oxygen ion generation promoting layer held in contact with the second oxide layer and positioned between the second oxide layer and the second electrode. Preferably, the oxygen ion generation promoting layer is made of a conductive oxide containing a noble metal. These arrangements are desirable for efficiently generating oxygen ions in the element.

BEST MODE FOR CARRYING OUT THE INVENTION

Figure 1:
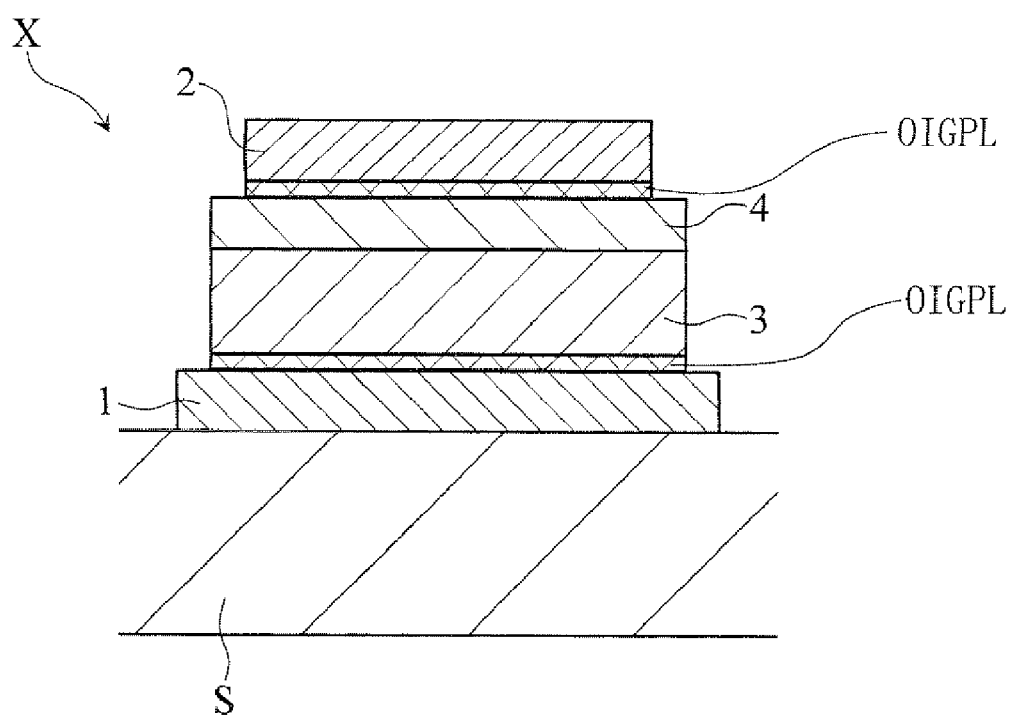
FIG. 1 is a sectional view illustrating a resistance variable element according to the present invention.

FIG. 1 is a sectional view illustrating a resistance variable element X according to the present invention. The resistance variable element X has a laminated structure made up of a substrate S, a pair of electrodes 1 and 2, an oxygen supplying layer 3 and an oxygen accepting layer 4. The resistance variable element is designed to be switchable between a high-resistance state in which less current flows and a low-resistance state in which more current flows.

The substrate S may be e.g. a silicon substrate or an oxide substrate. A thermal oxidation film may be formed on the surface of the silicon substrate. Examples of oxide substrate include an MgO substrate, an $SrTiO_3$ substrate, an $Al_2O_3$ substrate, a quartz substrate and a glass substrate.

The electrode 1 is a first electrode of the present invention and made of a good conductor of electricity such as noble metals or highly conductive oxides. Examples of the noble metals include Pt, Au, Pd, Ru and Ir. Examples of the highly conductive oxides include $SrRuO_3$, $RuO_2$, $IrO_2$, $SnO_2$, ZnO, and ITO. The electrode 1 may have a thickness of e.g. 50 to 200 nm.

The electrode 2 is a second electrode of the present invention and preferably made of a transition metal which is likely to change in valence. Examples of such transition metals include Ti, V, Cr, Mn, Fe, Co, Ni and Cu. Alternatively, the second electrode 2 may be made of a noble metal or a highly conductive oxide. Examples of the noble metals include Pt, Au, Pd, Ru and Ir. Examples of the highly conductive oxides include $SrRuO_3$, $RuO_2$, $IrO_2$, $SnO_2$, ZnO, and ITO. The electrode 2 may have a thickness of e.g. 50 to 200 nm.

The oxygen supplying layer 3 is a first oxide layer of the present invention. The oxygen supplying layer is positioned between the electrodes 1 and 2 to be in contact with the oxygen accepting layer 4 and selectively switchable between a high-resistance state and a low-resistance state. Specifically, the oxygen supplying layer 3 is capable of switching from the low-resistance state to the high-resistance state by donating oxygen ions to the oxygen accepting layer 4 and switching from the high-resistance state to the low-resistance state by accepting oxygen ions from the oxygen accepting layer 4. The oxygen supplying layer 4 may have a thickness of e.g. 10 to 50 nm. Preferably, the activation energy of the oxygen supplying layer 3 for the transfer of oxygen ions is not more than 2 eV.

In this embodiment, the oxygen supplying layer 3 is made of a conductive oxide, and more specifically, made of a fluorite structure oxide, a perovskite structure oxide, a pyrochlore structure oxide, a tungsten bronze structure oxide or a brownmillerite structure oxide. As the fluorite structure oxide, use may be made of $ZrO_2$ to which Y, Mg or Ca is added (partially stabilized zirconia), $ZrO_2$ and $CeO_2$. As the perovskite structure oxide, use may be made of $PrMnO_3$ and $SrTiO_3$. As the pyrochlore structure oxide, use may be made of $Nd_2Mo_2O_7$ and so on. As the tungsten bronze structure oxide, use may be made of $CuWO_3$ and so on. As the brownmillerite structure oxide, use may be made of $Sr_2Fe_2O_5$ and so on.

An alkaline earth element such as Ca may be added to the oxygen supplying layer 3. The oxygen supplying layer 3 may be in an oxygen deficient state. The oxygen deficient state means the state in which a significant amount of oxygen vacancies which are free of electric charge exist. These arrangements are effective for the enhancement of the conductivity and oxygen ion mobility of the oxygen supplying layer 3. The addition of an alkaline earth element is particularly effective when the oxygen supplying layer 3 is made of a perovskite structure oxide.

Preferably, the oxygen supplying layer is made of a crystalline material. The oxygen ion mobility of a solid electrolyte made of a crystalline material tends to be higher than that of a solid electrolyte made of an amorphous material. This is because the scattering factor for the oxygen ion transfer tends to be smaller in a crystalline material in which oxygen ions are movable than in an amorphous material in which oxygen ions are movable.

The oxygen accepting layer 4 is a second oxide layer of the present invention. The oxygen accepting layer is positioned between the electrodes 1 and 2 to be in contact with the oxygen supplying layer 3 and selectively switchable between a high-resistance state and a low-resistance state in cooperation with the switching of the resistance state of the oxygen supplying layer 3. Specifically, the oxygen accepting layer 4 is capable of switching from the low-resistance state to the high-resistance state by accepting oxygen ions from the oxygen supplying layer 3 and switching from the high-resistance state to the low-resistance state by donating oxygen ions to the oxygen supplying layer 3. The oxygen accepting layer 4 may have a thickness of e.g. 5 to 15 nm. Preferably, the activation energy of the oxygen accepting layer 4 for the oxygen ion transfer is not more than 2 eV.

In this embodiment, the oxygen accepting layer 4 is made of a conductive oxide of a transition metal which is likely to change in valence. The oxygen accepting layer is in an oxygen deficient state. For instance, the oxygen accepting layer 4 is made of an oxygen-deficient oxide of Ti, V, Cr, Mn, Fe, Co, Ni and Cu. In an oxide of a transition metal which is likely to change in valence in the oxygen deficient state, transition metals of different valences exist. Thus, such a transition metal oxide readily accepts oxygen ions for stabilizing the valence state of the transition metal. For an oxide of a transition metal which is likely to change in valence, the energy application required to discharge oxygen ions is relatively small.

Preferably, the oxygen accepting layer 4 is made of an amorphous material. For the oxygen accepting layer 4 to accept oxygen ions inherent in the oxygen supplying layer 3, an amorphous material which is structurally soft is preferable to a structurally hard crystalline material.

To manufacture the resistance variable element X having the above-described structure, an electrode 1 is first formed on a substrate S. Specifically, a film of a predetermined material is formed on the substrate S, and then the film is subjected to etching using a predetermined resist pattern as a mask, whereby the electrode 1 is formed as a pattern on the substrate S. As the technique to form the film, sputtering, vacuum deposition, CVD or LD (Laser Deposition) may be employed. The oxygen supplying layer 3, the oxygen accepting layer 4 and the electrode 2 can also be formed by similar film formation and subsequent patterning by etching.

For instance, when Pt is employed as the material of the electrode 1, a Pt film is formed on the substrate S by sputtering using a sputtering apparatus. The sputtering may be performed by DC discharge with the power of 1.0 kW at a temperature in the range of from room temperature to 300° C. using a Pt target and Ar gas (0.5 Pa) as the sputtering gas. When $SrRuO_3$ is employed as the material of the electrode 1, an $SrRuO_3$ film is formed on the substrate S by sputtering by DC or RF discharge with the power of 1.0 kW at a temperature in the range of from room temperature to 500° C. using an $SrRuO_3$ target and mixed gas of Ar and $O_2$ (0.5 Pa, oxygen concentration of 10 to 30 vol %) as the sputtering gas.

To manufacture the resistance variable element X, an oxygen supplying layer 3 is then formed on the electrode 1. For instance, when $ZrO_2$ to which a small amount (e.g. 1 to 10 at %) of Y is added is employed as the material of the oxygen supplying layer 3, a Y-added $ZrO_2$ film is formed by sputtering. In this case, the sputtering may be performed by RF discharge with the power of 1.0 kW at a temperature in the range of from room temperature to 300° C. using a Y-added $ZrO_2$ target and mixed gas of Ar and $O_2$ (0.5 Pa, oxygen concentration of 5 to 15 vol %) as the sputtering gas. When oxygen-deficient $ZrO_2$ is employed as the material of the oxygen supplying layer 3, sputtering may be performed by RF discharge with the power of 1.0 kW at a temperature in the range of from room temperature to 300° C. using a ZrO2 target and Ar gas (0.5 Pa) as the sputtering gas. By this process, a $ZrO_2$ film including many oxygen vacancies which are free of electric charge is formed. Alternatively, when $PrMnO_3$ to which a predetermined amount (e.g. 10 to 50 at %) of Ca is added (hereinafter described as "(Pr, Ca)$MnO_3$") is employed as the material of the oxygen supplying layer 3, a (Pr, Ca)$MnO_3$ film is formed by performing sputtering by RF discharge with the power of 1.0 kW at a temperature in the range of from room temperature to 500° C. using a (Pr, Ca)$MnO_3$ target and mixed gas of Ar and $O_2$ (0.5 Pa, oxygen concentration of 5 to 15 vol %) as the sputtering gas.

To manufacture the resistance variable element X, an oxygen accepting layer 4 is then formed on the oxygen supplying layer 3. When oxygen-deficient $TiO_2$ is employed as the material of the oxygen accepting layer 4, sputtering may be performed by RF discharge with the power of 1.0 kW at room temperature using a Ti target and mixed gas of Ar and $O_2$ (0.5 Pa, oxygen concentration of 1 to 10 vol %) as the sputtering gas. By this process, a $TiO_2$ film including many oxygen vacancies which are free of electric charge is formed. Alternatively, a $TiO_2$ film including many oxygen vacancies which are free of electric charge may be formed by sputtering performed by RF discharge with the power of 1.0 kW at room temperature using a $TiO_2$ target and Ar gas (0.5 Pa) as the sputtering gas.

To manufacture the resistance variable element X, an electrode 2 is then formed on the oxygen accepting layer 4. When Ti is employed as the material of the electrode 2, a Ti film is formed by performing sputtering by DC discharge with the power of 1.0 kW at a temperature in the range of from room temperature to 300° C. using a Ti target and Ar gas (0.5 Pa) as the sputtering gas. When Pt is employed as the material of the electrode 2, a Pt film is formed by performing sputtering by DC discharge with the power of 1.0 kW at a temperature in the range of from room temperature to 300° C. using a Pt target and Ar gas (0.5 Pa) as the sputtering gas. When $SrRuO_3$ is employed as the material of the electrode 2, an $SrRuO_3$ film is formed by performing sputtering by DC or RF discharge with the power of 1.0 kW at a temperature in the range of from room temperature to 500° C. using an $SrRuO_3$ target and mixed gas of Ar and $O_2$ (0.5 Pa, oxygen concentration of 10 to 30 vol %) as the sputtering gas.

As described above, the resistance variable element X is formed by successively forming an electrode 1, an oxygen supplying layer 3, an oxygen accepting layer 4 and an electrode 2 on a substrate S.

FIGS. 2A-2D illustrate the mechanism of operation of the resistance variable element X. FIG. 3 is a graph illustrating an example of current-voltage characteristics of the resistance variable element X. In the graph of FIG. 3, the horizontal axis indicates the voltage to be applied between the electrodes 1 and 2 of the resistance variable element X, whereas the vertical axis indicates the current through the resistance variable element X. In the graph of FIG. 3, the voltage applied to the resistance variable element X with the electrodes 1 and 2 held negative and positive, respectively, is expressed with a plus sign, whereas the voltage applied to the resistance variable element X with the electrodes 1 and 2 held positive and negative, respectively, is expressed with a minus sign. Further, in the graph of FIG. 3, the current which flows from the electrode 2 to the electrode 1 is expressed with a plus sign, whereas the current which flows from the electrode 1 to the electrode 2 is expressed with a minus sign.

Figure 2A:
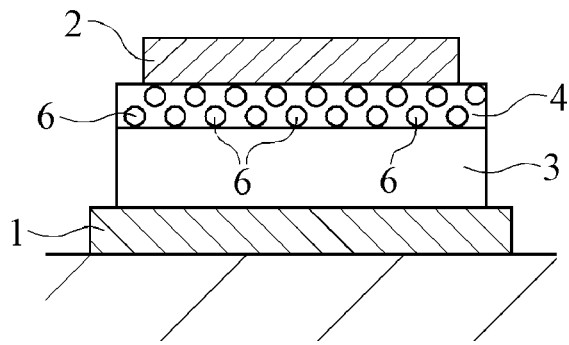
FIGS. 2A-2D illustrate the mechanism of operation according to the present invention.
Figure 3:
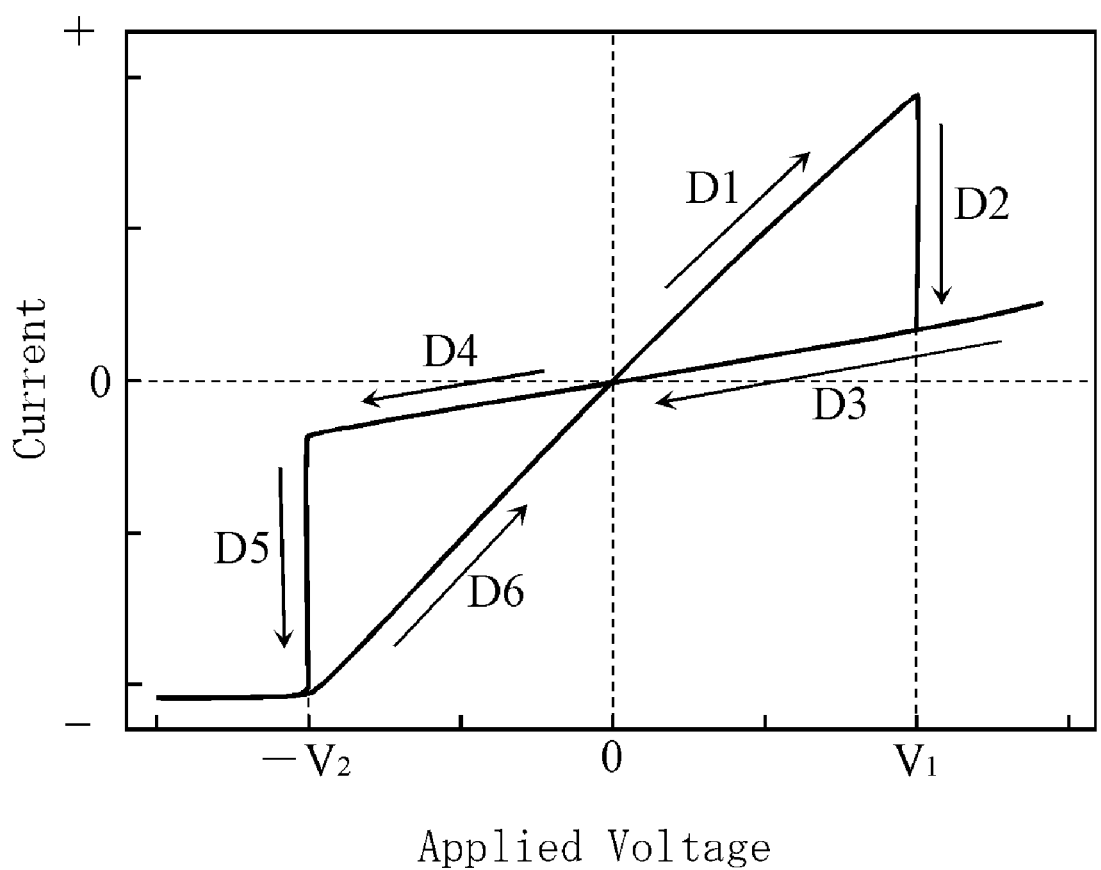
FIG. 3 is a graph illustrating an example of current-voltage characteristics of a resistance variable element according to the present invention.

As illustrated in FIG. 2A, in the resistance variable element X in the initial state after the manufacture, the oxygen supplying layer 3, which has not yet released oxygen ions, does not generate internal electric field due to oxygen deficiency (oxygen vacancies with positive electric charge) caused by oxygen ion release. Thus, the oxygen supplying layer is in the low-resistance state. In the oxygen accepting layer 4 which is in an oxygen deficient state and includes a significant amount of oxygen vacancies 6 (free of electric charge), the degree of oxidation by oxygen is relatively low, so that the oxygen accepting layer 4 is also in the low-resistance state. Thus, the resistance variable element X in the initial state is in the low-resistance state.

As indicated by e.g. the arrow D1 in FIG. 3, when the voltage between the electrodes 1 and 2 is increased gradually from 0V with the electrodes 1 and 2 held negative and positive, respectively, the current through the resistance variable element X gradually increases with a relatively high rate of change.

Figure 2B:
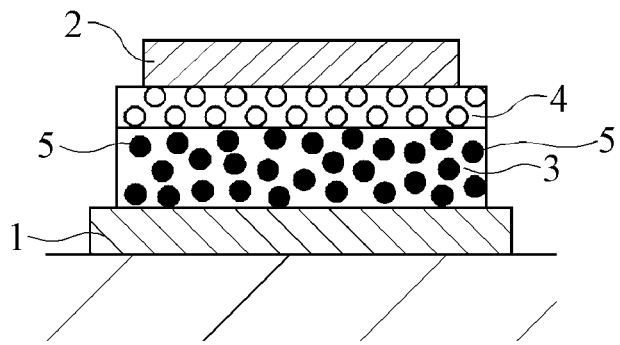
Figure 2C:
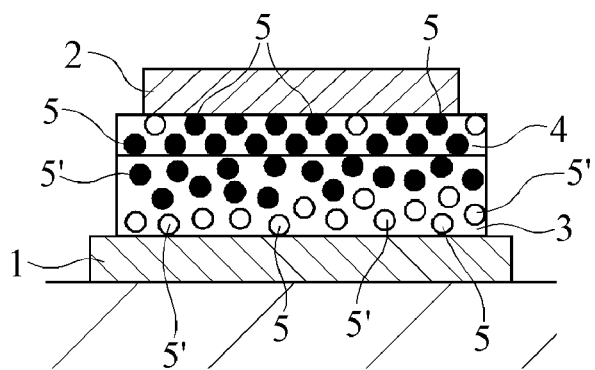

When the voltage is increased to exceed a predetermined voltage $V_1$, oxygen ions 5 are generated in the oxygen supplying layer 3 due to the electric field effect between the electrodes 1 and 2, as illustrated in e.g. FIG. 2B. Then, as illustrated in e.g. FIG. 2C, oxygen ions 5 move from the oxygen supplying layer 3 into the oxygen accepting layer 4. When the donation of oxygen ions from the oxygen supplying layer 3 to the oxygen accepting layer 4 occurs in this way, positive charge deficiencies 5' (positively-charged oxygen vacancies) are generated in the oxygen supplying layer 3 or the positive charge deficiencies 5' in the oxygen supplying layer 3 increase. In the oxygen supplying layer 3, the positive charge deficiencies 5' are localized to a portion close to the electrode 1. As a result, an internal electric field having an opposite polarity from the applied voltage is generated in the oxygen supplying layer 3. The internal electric field hinders the movement of electrons or holes which are the main carriers in the resistance variable element X. Thus, due to the oxygen ion donation from the oxygen supplying layer 3 to the oxygen accepting layer 4, the oxygen supplying layer 3 shifts from the low-resistance state to the high-resistance state. On the other hand, the oxygen accepting layer 4 is further oxidized (i.e., the degree of oxidation by oxygen increases) by accepting oxygen ions 5 from the oxygen supplying layer 3. The increase in the degree of oxidation hinders the movement of electrons or holes which are the main carriers in the resistance variable element X. Thus, by accepting oxygen ions from the oxygen supplying layer 3, the oxygen accepting layer 4 shifts from the low-resistance state to the high-resistance state. In this way, since both of the oxygen supplying layer 3 and the oxygen accepting layer 4 shift from the low-resistance state to the high-resistance state, the resistance variable element X shifts from the low-resistance state to the high-resistance state, which appears as the current drop indicated by e.g. the arrow D2 in FIG. 3. The above-described voltage $V_1$ in the process for shifting to the high-resistance state is the minimum voltage necessary for the resistance variable element X to shift from the low-resistance state to the high-resistance state due to the above-described mechanism, and may be 2 to 4 V, for example.

When the electrode 2 includes or is made of a transition metal which is likely to change in valence, the electrode 2 is capable of accepting part of the oxygen ions 5 from the oxygen accepting layer 4 when an excessive amount of oxygen ions 5 are donated from the oxygen supplying layer 3 to the oxygen accepting layer 4 in the above-described process for shifting to the high-resistance state. This structure in which not only the oxygen accepting layer 4 but also the electrode 2 are capable of accepting oxygen ions 5 is desirable for preventing the resistance variable element X from malfunctioning when an excessive amount of oxygen ions 5 are donated from the oxygen supplying layer 3 to the oxygen accepting layer 4.

After the resistance variable element X is shifted to the high-resistance state in the above-described manner, the oxygen supplying layer 3 and the oxygen accepting layer 4, and hence the resistance variable element X maintain the high-resistance state even when the voltage is reduced to below $V_1$ with the electrodes 1 and 2 kept negative and positive, respectively. In this voltage reduction process, as indicated by e.g. the arrow D3 in FIG. 3, the current through the resistance variable element X gradually reduces with a relatively low rate of change.

When the voltage between the electrodes 1 and 2 of the resistance variable element X, which is in the high-resistance state, is gradually increased from 0V with the electrodes 1 and 2 held positive and negative, respectively, the absolute value of the current through the resistance variable element X gradually increases with a relatively low rate of change as indicated by e.g. the arrow D4 in FIG. 3.

Figure 2D:
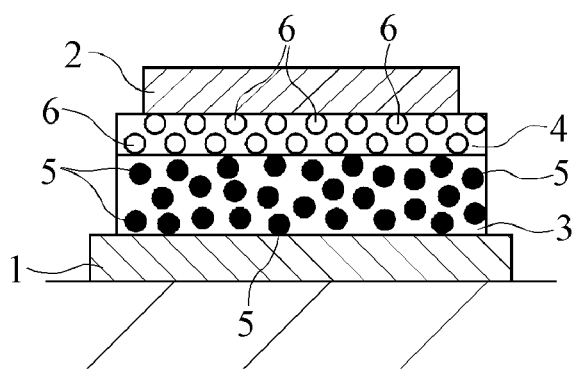

When the voltage is increased to exceed a predetermined voltage $V_2$, oxygen ions 5 are returned from the oxygen accepting layer 4 to the oxygen supplying layer 3 due to the electric field effect between the electrodes 1 and 2, as illustrated in FIG. 2D, for example. By this donation of oxygen ions from the oxygen accepting layer 4 to the oxygen supplying layer 3, the oxygen accepting layer 4 is reduced (i.e., the degree of oxidation by oxygen reduces). This reduction in the degree of oxidation is desirable for the movement of electrons or holes which are the main carriers in the resistance variable element X. Thus, by the donation of oxygen ions from the oxygen accepting layer 4 to the oxygen supplying layer 3, the oxygen accepting layer 4 shifts from the high-resistance state to the low-resistance state. Meanwhile, due to the acceptance of oxygen ions 5 from the oxygen accepting layer 4, the positive charge deficiencies 5' in the oxygen supplying layer 3 reduce or disappear. As a result, the inner electric field generated in the oxygen supplying layer 3 decays or disappears. This is effective for the movement of electrons or holes which are the main carriers in the resistance variable element X. Thus, by accepting oxygen ions from the oxygen accepting layer 4, the oxygen supplying layer 3 shifts from the high-resistance state to the low-resistance state. In this way, since both of the oxygen supplying layer 3 and the oxygen accepting layer 4 shift from the high-resistance state to the low-resistance state, the resistance variable element X shifts from the high-resistance state to the low-resistance state, which appears as the current change indicated by e.g. the arrow D5 in FIG. 3. The above-described voltage $V_2$ in the process for shifting to the low-resistance state is the minimum voltage necessary for the resistance variable element X to shift from the high-resistance state to the low-resistance state due to the above-described mechanism, and may be 2 to 4 V, for example.

The oxygen supplying layer 3 and the oxygen accepting layer 4, and hence the resistance variable element X maintain the low-resistance state even when the voltage is thereafter reduced to below $V_2$ with the electrodes 1 and 2 kept positive and negative, respectively. In this voltage reduction process, as indicated by e.g. the arrow D6 in FIG. 3, the absolute value of the current through the resistance variable element X gradually reduces with a relatively high rate of change.

The resistance variable element X shifted to the low-resistance state can be shifted to the high-resistance state again through the above-described process for shifting to the high-resistance state. Thus, by appropriately undergoing the above-described process for shifting to the high-resistance state and process for shifting to the low-resistance state, the resistance variable element X is selectively switched between the high-resistance state in which less current flows and the low-resistance state in which more current flows. The direction of voltage application between the electrodes 1 and 2 in the process for shifting from the low-resistance state to the high-resistance differs from that in the process for shifting from the high-resistance state to the low-resistance state.

When the resistance variable element X switches between the high-resistance state and the low-resistance state, oxygen ions 5 move reversibly within the oxygen supplying layer 3, within the oxygen accepting layer 4 and between these two layers.

As described above, the resistance variable element X is properly switched between the high-resistance state in which less current flows and the low-resistance state in which more current flows by the bipolar operation. With this resistance variable element X, recording or rewriting of information can be performed by utilizing the selective switching of the resistance state. Thus, the resistance variable element X can be used as a resistance-variable nonvolatile memory element. Further, the resistance variable element X can also be used as a switching element for selectively changing the resistance at a predetermined point in a circuit.

The resistance variable element X may further include an oxygen ion generation promoting layer (OIGPL) between the electrode 1 and the oxygen supplying layer 3 or between the electrode 2 and the oxygen accepting layer 4. The oxygen ion generation promoting layer is a portion for promoting the generation of oxygen ions 5 which are to move within the oxygen supplying layer 3 and the oxygen accepting layer 4. The oxygen ion generation promoting layer may be made of a conductive oxide containing a noble metal capable of acting as a catalyst for the generation of oxygen ions. Examples of such noble metal include Pt, Au, Pd, Ru and Ir. The concentration of the noble metal in the conductive oxide forming the oxygen ion generation promoting layer may be e.g. 10 to 50 at %. The thickness of the oxygen ion generation promoting layer may be e.g. 1 to 5 nm.

Example

Sample Element S1

Figures 4A, 4B:
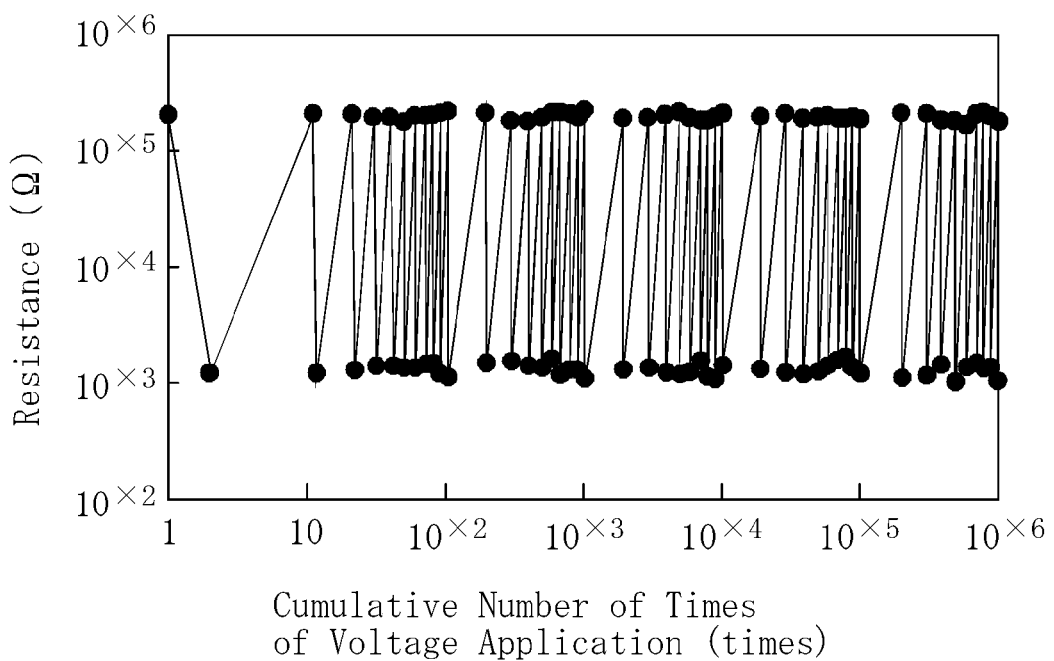
FIG. 4A illustrates the laminated structure of a sample element S1.
FIG. 4B is a graph illustrating the measurements of resistance of the sample element S1.

A sample element S1 having the laminated structure illustrated in FIG. 4A was prepared as a resistance variable element. The facing area of the electrodes 1 and 2 of the sample element S1 is 31400 $\mu m^2$. (The facing area of the paired electrodes of each of the sample elements S2-S12, which will be described later, is also 31400 $\mu m^2$.) In the initial state before voltage application, the sample element S1 was in the low-resistance state.

The change of the resistance of the sample element S1 was examined. Specifically, while measuring the resistance between the electrodes 1 and 2 of the sample element S1, voltage application under the first condition and that under the second condition were repetitively performed with respect to the sample element S1. Specifically, under the first condition, a pulse voltage with a pulse amplitude of 5V and a pulse width of 10 nsec was applied across the electrodes, with the electrode 1 and the electrode 2 held negative and positive, respectively. Under the second condition, a pulse voltage with a pulse amplitude of 5V and a pulse width of 10 nsec was applied across the electrodes, with the electrode 1 and the electrode 2 held positive and negative, respectively.

Part of the resistances of the sample element S1 successively measured in this resistance change examination is picked up and illustrated in the graph of FIG. 4B. In the graph of FIG. 4B, the horizontal axis indicates the cumulative number of times of voltage application expressed on a common logarithm scale, whereas the vertical axis indicates the resistance ($\Omega$) expressed on a common logarithm scale. Each plot (•) represents the measured resistance. This holds true for the subsequent graphs.

Sample Element S2

Figures 5A, 5B:
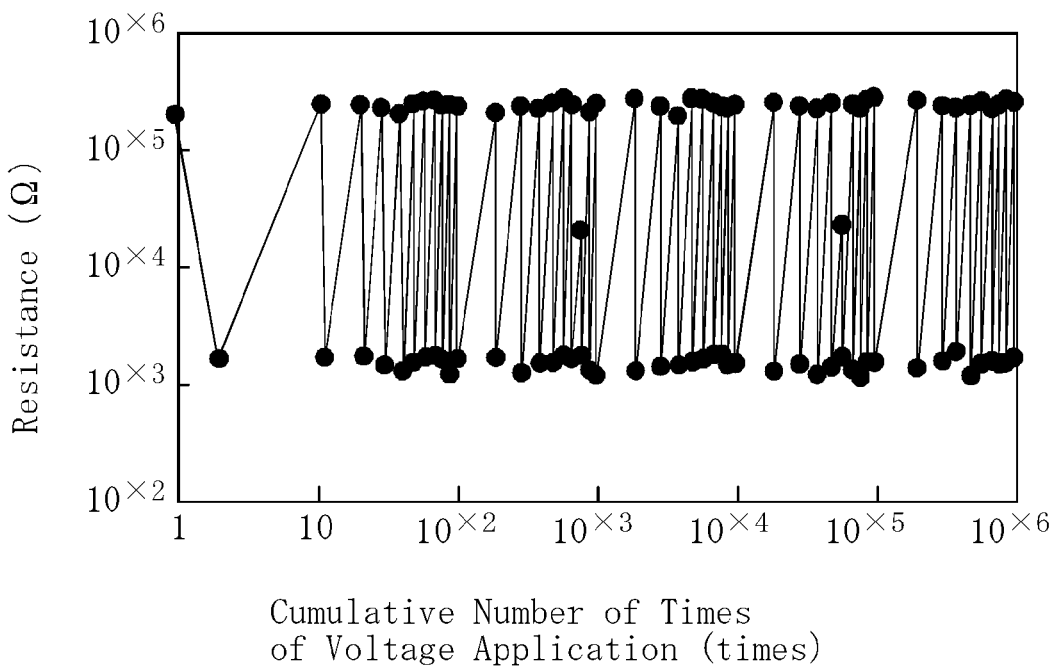
FIG. 5A illustrates the laminated structure of a sample element S2.
FIG. 5B is a graph illustrating the measurements of resistance of the sample element S2.

A sample element S2 having the laminated structure illustrated in FIG. 5A was prepared as a resistance variable element. In the initial state before voltage application, the sample element S2 was in the low-resistance state. The resistance of the sample element S2 was examined under the same conditions as those for the sample element S1. Part of the resistances of the sample element S2 successively measured in this resistance change examination is picked up and plotted in the graph of FIG. 5B.

Sample Element S3

Figures 6A, 6B:
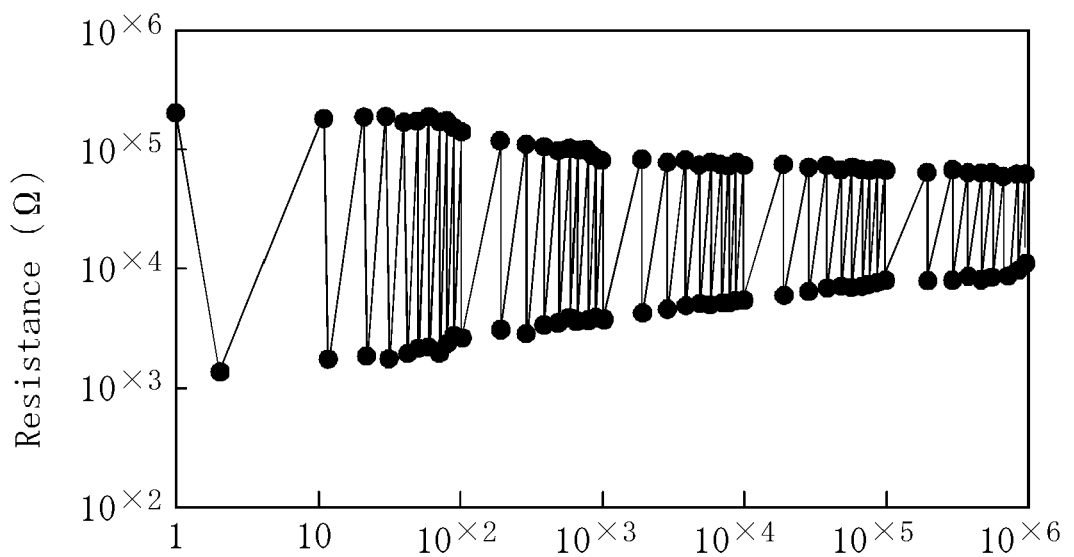
FIG. 6A illustrates the laminated structure of a sample element S3.
FIG. 6B is a graph illustrating the measurements of resistance of the sample element S3.

A sample element S3 having the laminated structure illustrated in FIG. 6A was prepared as a resistance variable element. In the initial state before voltage application, the sample element S3 was in the low-resistance state. The change of the resistance of the sample element S3 was examined under the same conditions as those for the sample element S1. Part of the resistances of the sample element S3 successively measured in this resistance change examination is picked up and plotted in the graph of FIG. 6B.

Sample Element S4

Figures 7A, 7B:
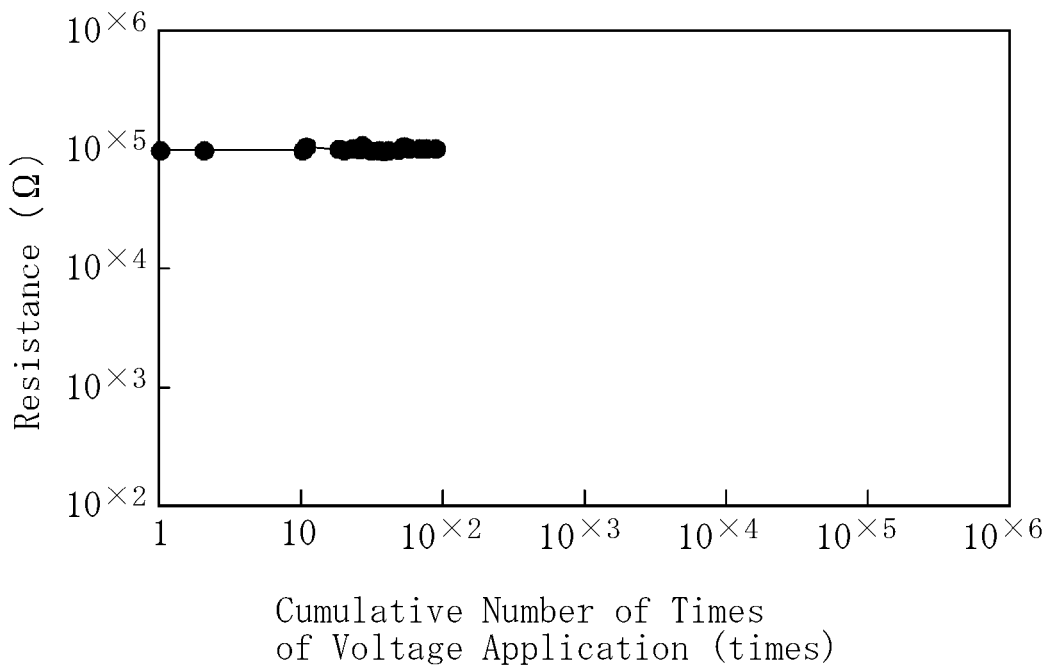
FIG. 7A illustrates the laminated structure of a sample element S4.
FIG. 7B is a graph illustrating the measurements of resistance of the sample element S4.

A sample element S4 having the laminated structure illustrated in FIG. 7A was prepared. The change of resistance of the sample element S4 was examined under the same conditions as those for the sample element S1. Part of the resistances of the sample element S4 successively measured in this resistance change examination is picked up and plotted in the graph of FIG. 7B.

Sample Element S5

Figures 8A, 8B:
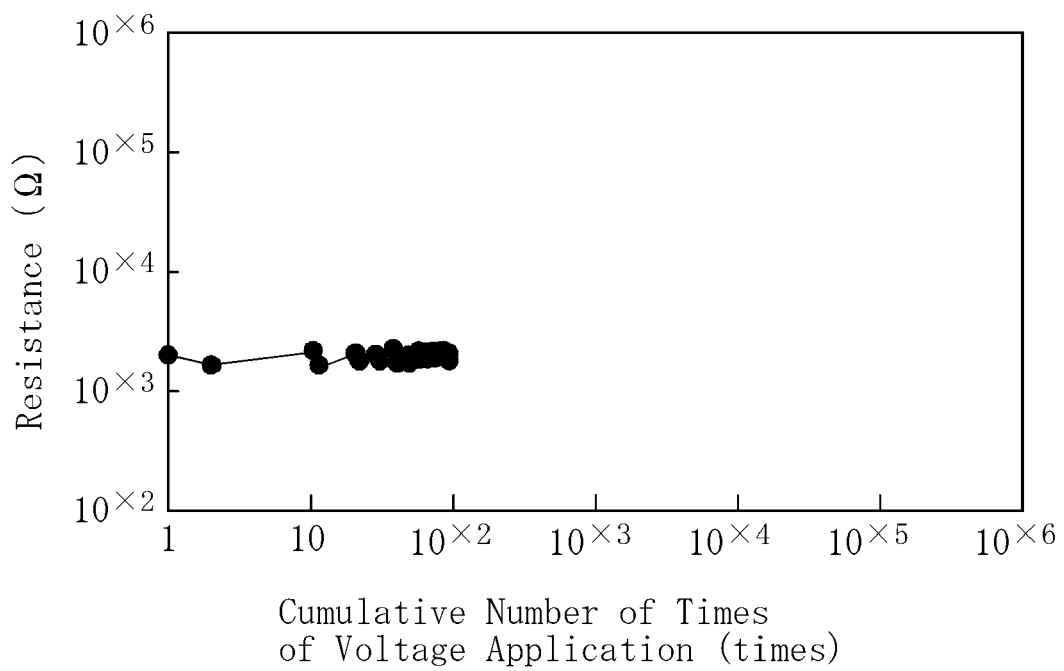
FIG. 8A illustrates the laminated structure of a sample element S5.
FIG. 8B is a graph illustrating the measurements of resistance of the sample element S5.

A sample element S5 having the laminated structure illustrated in FIG. 8A was prepared. The change of the resistance of sample element S5 was examined under the same conditions as those for the sample element S1. Part of the resistances of the sample element S5 successively measured in this resistance change examination is picked up and plotted in the graph of FIG. 8B.

Sample Element S6

Figures 9A, 9B:
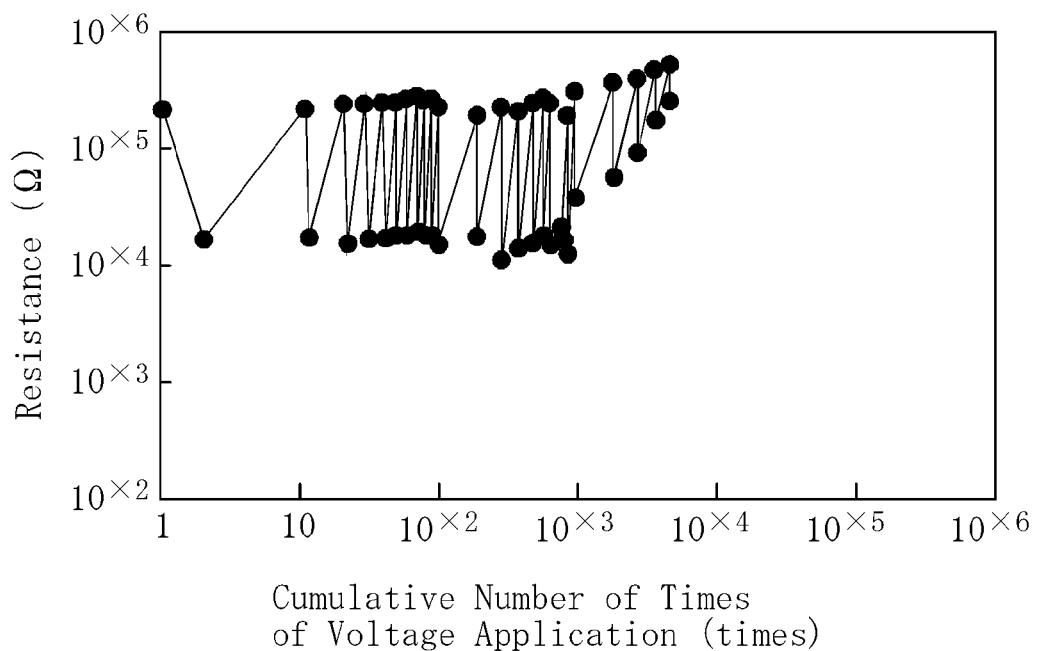
FIG. 9A illustrates the laminated structure of a sample element S6.
FIG. 9B is a graph illustrating the measurements of resistance of the sample element S6.

A sample element S6 having the laminated structure illustrated in FIG. 9A was prepared as a resistance variable element. In the initial state before voltage application, the sample element S6 was in the low-resistance state. The change of the resistance of the sample element S6 was examined under the same conditions as those for the sample element S1. Part of the resistances of the sample element S6 successively measured in this resistance change examination is picked up and plotted in the graph of FIG. 9B.

Sample Element S7

Figures 10A, 10B:
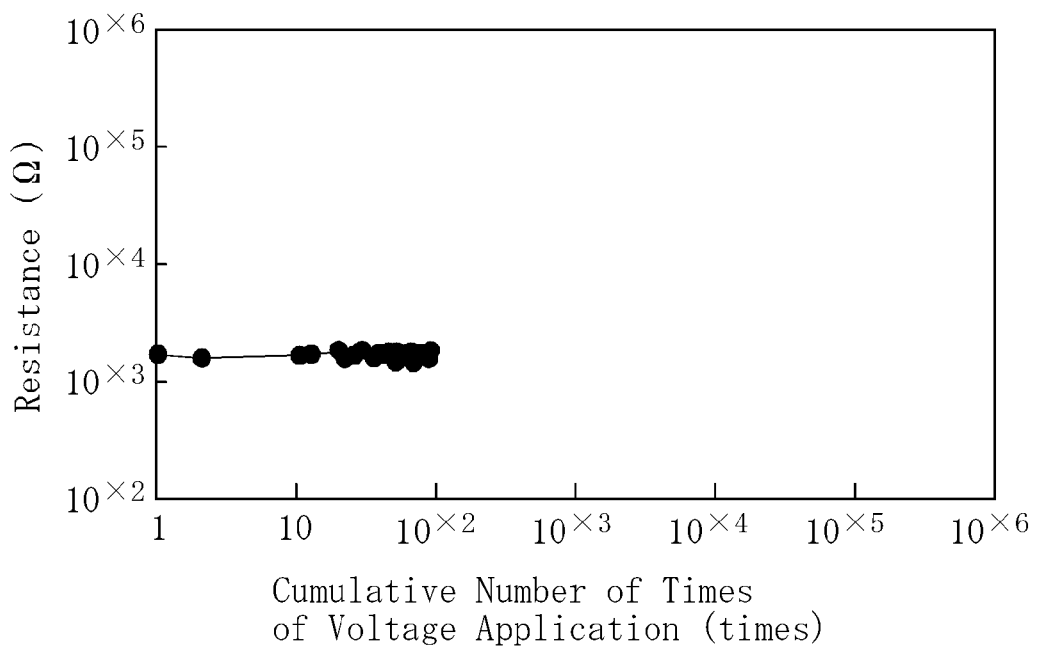
FIG. 10A illustrates the laminated structure of a sample element S7.
FIG. 10B is a graph illustrating the measurements of resistance of the sample element S7.

A sample element S7 having the laminated structure illustrated in FIG. 10A was prepared. The change of the resistance of the sample element S7 was examined under the same conditions as those for the sample element S1. Part of the resistances of the sample element S7 successively measured in this resistance change examination is picked up and plotted in the graph of FIG. 10B.

Sample Element S8

Figures 11A, 11B:
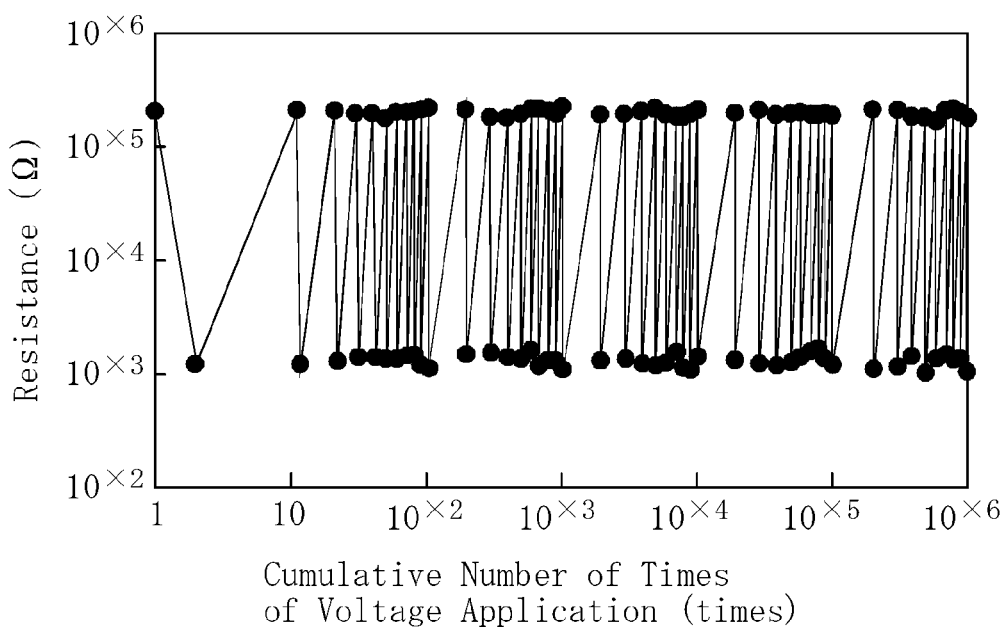
FIG. 11A illustrates the laminated structure of a sample element S8.
FIG. 11B is a graph illustrating the measurements of resistance of the sample element S8.

A sample element S8 having the laminated structure illustrated in FIG. 11A was prepared as a resistance variable element. In the initial state before voltage application, the sample element S8 was in the low-resistance state. The change of the resistance of the sample element S8 was examined under the same conditions as those for the sample element S1 except that a pulse voltage with a pulse amplitude of 20V was applied instead of the pulse voltage with a pulse amplitude of 5V. Part of the resistances of the sample element S8 successively measured in this resistance change examination is picked up and plotted in the graph of FIG. 11B.

Sample Element S9

Figures 12A, 12B:
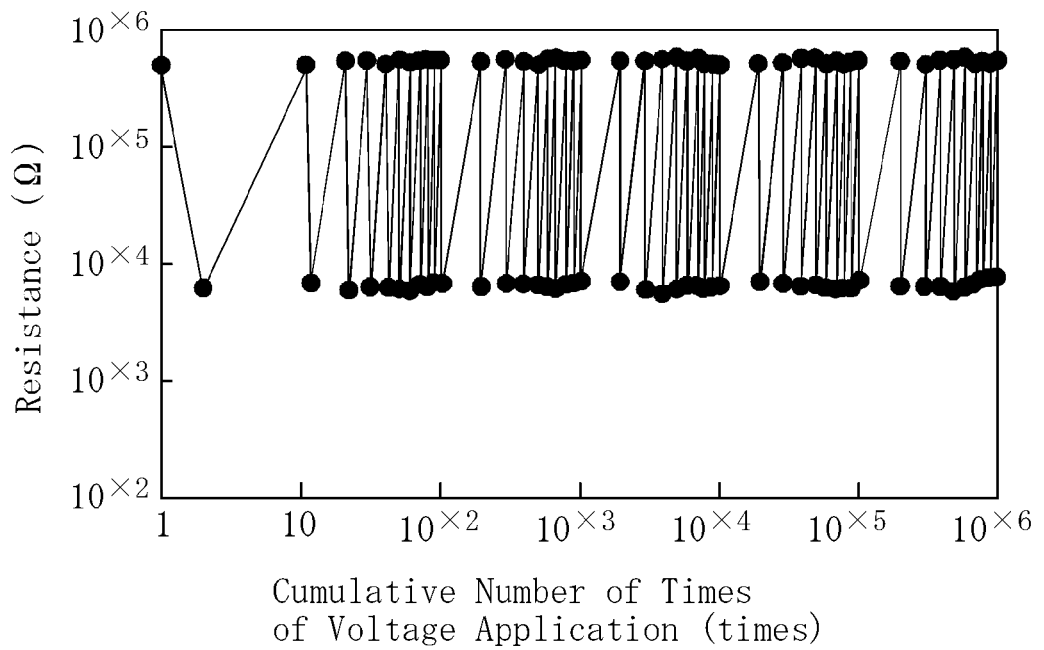
FIG. 12A illustrates the laminated structure of a sample element S9.
FIG. 12B is a graph illustrating the measurements of resistance of the sample element S9.

A sample element S9 having the laminated structure illustrated in FIG. 12A was prepared as a resistance variable element. In the initial state before voltage application, the sample element S9 was in the low-resistance state. The change of the resistance of the sample element S9 was examined under the same conditions as those for the sample element S1. Part of the resistances of the sample element S9 successively measured in this resistance change examination is picked up and plotted in the graph of FIG. 12B.

Sample Element S10

Figures 13A, 13B:
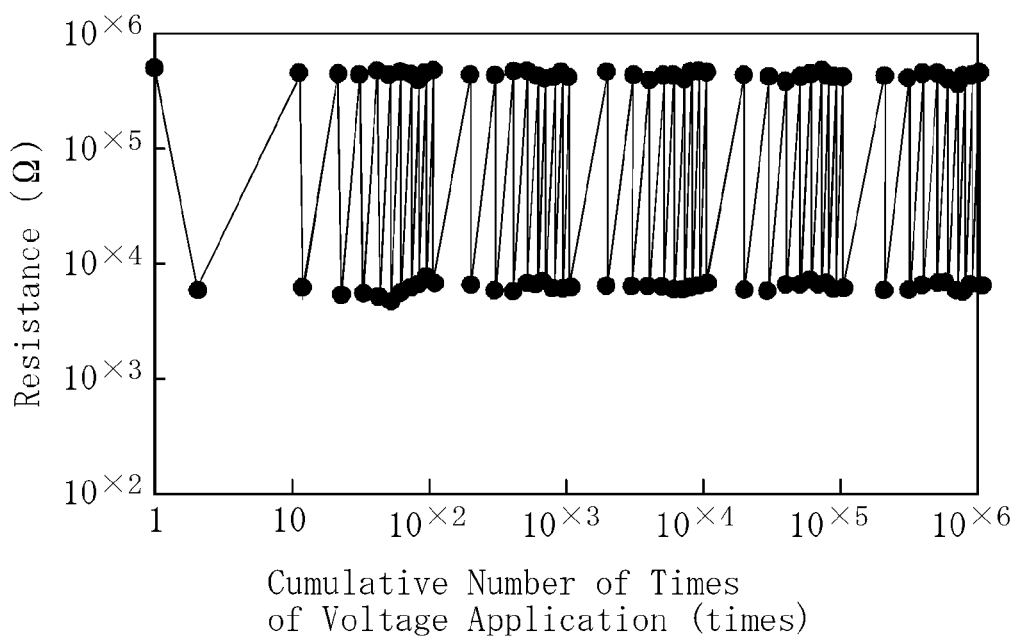
FIG. 13A illustrates the laminated structure of a sample element S10.
FIG. 13B is a graph illustrating the measurements of resistance of the sample element S10.

A sample element S10 having the laminated structure illustrated in FIG. 13A was prepared as a resistance variable element. In the initial state before voltage application, the sample element S10 was in the low-resistance state. The change of the resistance of the sample element S10 was examined under the same conditions as those for the sample element S1 except that a pulse voltage with a pulse amplitude of 15V was applied instead of the pulse voltage with a pulse amplitude of 5V. Part of the resistances of the sample element S10 successively measured in this resistance change examination is picked up and plotted in the graph of FIG. 13B.

Sample Element S11

Figures 14A, 14B:
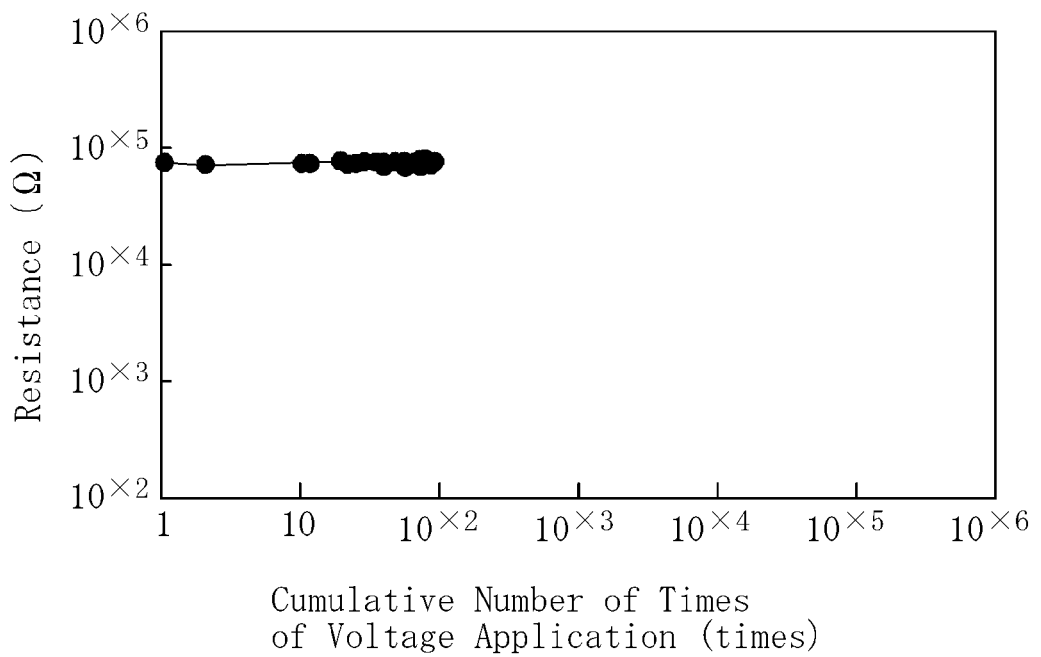
FIG. 14A illustrates the laminated structure of a sample element S11.
FIG. 14B is a graph illustrating the measurements of resistance of the sample element S11.

A sample element S11 having the laminated structure illustrated in FIG. 14A was prepared. The change of the resistance of the sample element S11 was examined under the same conditions as those for the sample element S1. Part of the resistances of the sample element S11 successively measured in this resistance change examination is picked up and plotted in the graph of FIG. 14B.

Sample Element S12

Figures 15A, 15B:
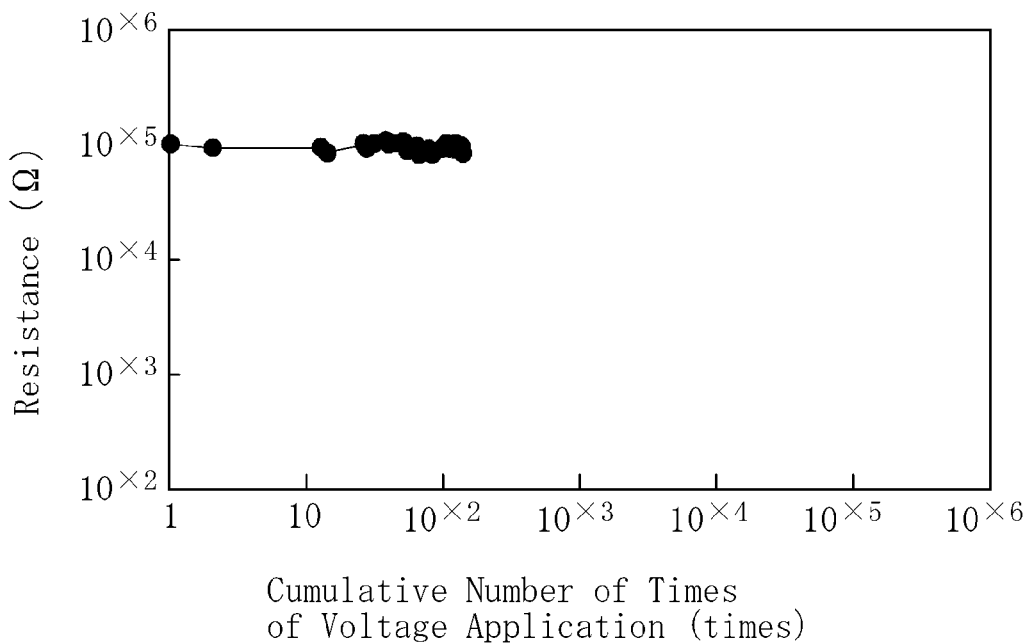
FIG. 15A illustrates the laminated structure of a sample element S12.
FIG. 15B is a graph illustrating the measurements of resistance of the sample element S12.

A sample element S12 having the laminated structure illustrated in FIG. 15A was prepared. The change of the resistance of the sample element S12 was examined under the same conditions as those for the sample element S1. Part of the resistances of the sample element S4 successively measured in this resistance change examination is picked up and plotted in the graph of FIG. 15B.

Evaluation:

As will be easily understood by comparing FIGS. 9A and 10A, the sample elements S6 and S7 have the same structure except the electrode 2. Whereas the sample element S6 exhibited the switching of the resistance state, the sample element S7 did not exhibit the switching of the resistance state. This result indicates that whether or not resistance switching is possible can depend on the kind of the material forming the electrode 2 bonded to the oxygen accepting layer 4.

As will be easily understood by comparing FIGS. 4A and 9A, the sample element S1 has the same structure as that of the sample element S6 except that the sample element S1 additionally includes the oxygen accepting layer 4. In the sample element S1 including the oxygen accepting layer 4, the resistance difference between the high-resistance state and the low-resistance state is larger and the resistance switching is more frequent than in the sample element S6 which does not include the oxygen accepting layer 4.

As will be easily understood by comparing FIGS. 5A and 10A, the sample element S2 has the same structure as that of the sample element S7 except that the sample element S2 additionally includes the oxygen accepting layer 4. Whereas the sample element S2 including the oxygen accepting layer 4 exhibited the switching of the resistance state, the sample element S7 which did not include the oxygen accepting layer 4 did not exhibit the switching of the resistance state. This result indicates that the interposition of the oxygen accepting layer 4 between the oxygen supplying layer 3 and the electrode 2 enables the resistance switching.

As will be easily understood by comparing FIGS. 4A and 6A, the sample element S1 has the same structure as that of the sample element S3 except that the oxygen accepting layer 4 of the sample element S1 is not crystalline but amorphous. In the sample element S1 including the amorphous oxygen accepting layer 4, the resistance difference between the high-resistance state and the low-resistance state is uniform and larger than that in the sample element S3 including the crystalline oxygen accepting layer 4.

As will be easily understood by comparing FIGS. 4A and 7A, the sample element S4 has the same structure as that of the sample element S1 except that the sample element S4 includes a $TiO_2$ layer which is amorphous and is not in an oxygen deficient state as a pseudo oxygen accepting layer between the oxygen supplying layer 3 and the electrode 2. The base material of the oxygen accepting layer 4 of the sample element S1 and that of the pseudo oxygen accepting layer of the sample element S4 are the same, i.e., $TiO_2$. Although the sample element S1 exhibited the switching of the resistance state, the sample element S4 did not exhibit the switching of the resistance state. This result indicates that the resistance switching is possible when the layer intervening between the oxygen supplying layer 3 and the electrode 2 is made of an oxide-deficient oxide.

As will be easily understood by comparing FIGS. 4A and 8A, the sample element S5 has the same structure as that of the sample element S1 except that the sample element S5 includes an ZnO layer which is amorphous and is in an oxygen deficient state as a pseudo oxygen accepting layer between the oxygen supplying layer 3 and the electrode 2. The sample element S1 includes a $TiO_2$ layer which is amorphous and is in an oxygen deficient state as the oxygen accepting layer 4. Whereas the sample element S1 exhibited the switching of the resistance state, the sample element S5 did not exhibit the switching of the resistance state. This result indicates that whether or not resistance switching is possible can depend on the kind of the base material of the layer interposed between the oxygen supplying layer 3 and the electrode 2.

As will be easily understood by comparing FIGS. 4A and 11A, the sample element S1 has the same structure as that of the sample element S8 except that the oxygen supplying layer 3 of the sample element S1 is not amorphous but crystalline. As noted before, while the pulse amplitude of the voltage applied to the sample element S1 was 5V, the pulse amplitude of the voltage applied to the sample element S8 was 20V. As illustrated in FIGS. 4B and 11B, the sample elements S1 and S8 exhibited the substantially same resistance switching. In this way, the sample element S1 including the crystalline oxygen supplying layer 3 is operable by the application of a lower voltage than that for operating the sample element S8 including the amorphous oxygen supplying layer 3.

As will be easily understood by comparing FIGS. 12A and 13A, the sample element S9 has the same structure as that of the sample element S10 except that the oxygen supplying layer 3 of the sample element S9 is not amorphous but crystalline. As noted before, while the pulse amplitude of the voltage applied to the sample element S9 was 5V, the pulse amplitude of the voltage applied to the sample element S10 was 15V. As illustrated in FIGS. 12B and 13B, the sample elements S9 and S10 exhibited the substantially same resistance switching. In this way, the sample element S9 including the crystalline oxygen supplying layer 3 is operable by the application of a lower voltage than that for operating the sample element S10 including the amorphous oxygen supplying layer 3.

As will be easily understood by comparing FIGS. 12A and 14A, the sample element S11 has the same structure as that of the sample element S9 except that the sample element S11 includes a crystalline $ZrO_2$ layer as a pseudo oxygen supplying layer between the electrode 1 and the oxygen accepting layer 4. The sample element S9 includes a $ZrO_2$ layer which is crystalline and is in an oxygen deficient state as the oxygen supplying layer 3. Whereas the sample element S9 exhibited the switching of the resistance state, the sample element S11 did not exhibit the switching of the resistance state. This result indicates that even when the kind of the base material of the layer interposed between the electrode 1 and the oxygen accepting layer 4 is the same, whether or not resistance switching is possible can depend on whether or not oxygen is deficient.

As will be easily understood by comparing FIGS. 12A and 15A, the sample element S12 has the same structure as that of the sample element S9 except that the sample element S12 includes an $Al_2O_3$ layer which is crystalline and is in an oxygen deficient state as a pseudo oxygen supplying layer between the electrode 1 and the oxygen accepting layer 4. The sample element S9 includes a $ZrO_2$ layer which is crystalline and is in an oxygen deficient state as the oxygen supplying layer 3. Whereas the sample element S9 exhibited the switching of the resistance state, the sample element S12 did not exhibit the switching of the resistance state. This result indicates that whether or not resistance switching is possible can depend on the kind of the base material of the layer interposed between the electrode 1 and the oxygen accepting layer 4.

The invention claimed is:

1. A resistance variable element of a laminated structure comprising:
 a first electrode;
 a second electrode;
 a first oxide layer positioned between the first electrode and the second electrode;
 a second oxide layer held in contact with the first oxide layer and positioned between the first oxide layer and the second electrode; and
 an oxygen ion generation promoting layer held in contact with the first oxide layer and positioned between the first oxide layer and the first electrode;
 wherein the first oxide layer is switchable from a low-resistance state to a high-resistance state by donating oxygen ions to the second oxide layer and switchable from a high-resistance state to a low-resistance state by accepting oxygen ions from the second oxide layer;
 wherein the second oxide layer is switchable from a low-resistance state to a high-resistance state by accepting oxygen ions from the first oxide layer and switchable from a high-resistance state to a low-resistance state by donating oxygen ions to the first oxide layer;
 wherein the first oxide layer is greater in thickness than the second oxide layer;
 wherein the oxygen ion generation promoting layer promotes the generation of oxygen ions which are to move within the first oxide layer and the second oxide layer; and
 wherein the oxygen ion generation promoting layer is made of a conductive oxide containing a noble metal.

2. The resistance variable element according to claim 1, wherein the oxygen ion donation from the first oxide layer to the second oxide layer causes positively-charged oxygen vacancies to be generated or increased in the first oxide layer and causes the second oxide layer to be oxidized.

3. The resistance variable element according to claim 2, wherein the oxygen ion donation from the second oxide layer to the first oxide layer causes the second oxide layer to be reduced and the oxygen vacancies in the first oxide layer to reduce or disappear.

4. The resistance variable element according to claim 1, wherein the first oxide layer and/or the second oxide layer is made of a conductive oxide.

5. The resistance variable element according to claim 1, wherein an alkaline earth element is added to the first oxide layer.

6. The resistance variable element according to claim 1, wherein the first oxide layer and/or the second oxide layer is in an oxygen deficient state.

7. The resistance variable element according to claim 1, wherein the first oxide layer is made of a fluorite structure oxide or a perovskite structure oxide.

8. The resistance variable element according to claim 1, wherein the first oxide layer contains $ZrO_2$ to which Y, Ca or Mg is added, $ZrO_2$, $CeO_2$, $PrMnO_3$ or $SrTiO_3$.

9. The resistance variable element according to claim 1, wherein the first oxide layer is made of a crystalline material.

10. The resistance variable element according to claim 1, wherein the second oxide layer is made of a transition metal oxide.

11. The resistance variable element according to claim 1, wherein the second electrode contains a transition metal.

12. A resistance variable element of a laminated structure comprising:
 a first electrode;
 a second electrode;
 a first oxide layer positioned between the first electrode and the second electrode;
 a second oxide layer held in contact with the first oxide layer and positioned between the first oxide layer and the second electrode; and
 an oxygen ion generation promoting layer held in contact with the second oxide layer and positioned between the second oxide layer and the second electrode;
 wherein the first oxide layer is switchable from a low-resistance state to a high-resistance state by donating oxygen ions to the second oxide layer and switchable from a high-resistance state to a low-resistance state by accepting oxygen ions from the second oxide layer;
 wherein the second oxide layer is switchable from a low-resistance state to a high-resistance state by accepting oxygen ions from the first oxide layer and switchable from a high-resistance state to a low-resistance state by donating oxygen ions to the first oxide layer;
 wherein the first oxide layer is greater in thickness than the second oxide layer;

wherein the oxygen ion generation promoting layer promotes the generation of oxygen ions which are to move within the first oxide layer and the second oxide layer; and
wherein the oxygen ion generation promoting layer is made of a conductive oxide containing a noble metal.

* * * * *

UNITED STATES PATENT AND TRADEMARK OFFICE
CERTIFICATE OF CORRECTION

| | |
|---|---|
| PATENT NO. | : 8,188,466 B2 |
| APPLICATION NO. | : 12/423429 |
| DATED | : May 29, 2012 |
| INVENTOR(S) | : Hiroyasu Kawano et al. |

It is certified that error appears in the above-identified patent and that said Letters Patent is hereby corrected as shown below:

On the Face of the Patent:

(56) References Cited:

Under "U.S. PATENT DOCUMENTS"

Delete:
"2009/0012823 A1 1/2009 Anderson et al."

and replace with:

2009/0121823 A1 5/2009 Kawano et al.

Signed and Sealed this
Thirty-first Day of July, 2012

David J. Kappos
*Director of the United States Patent and Trademark Office*